(12) United States Patent
Lee et al.

(10) Patent No.: US 7,742,347 B2
(45) Date of Patent: Jun. 22, 2010

(54) VOLTAGE GENERATING CIRCUIT AND REFERENCE VOLTAGE GENERATING CIRCUIT FOR SEMICONDUCTOR MEMORY APPARATUS, AND SEMICONDUCTOR SYSTEM USING THE SAME

(75) Inventors: Dong Uk Lee, Ichon (KR); Shin Deok Kang, Ichon (KR)

(73) Assignee: Hynix Semiconductor Inc. (KR)

( * ) Notice: Subject to any disclaimer, the term of this patent is extended or adjusted under 35 U.S.C. 154(b) by 172 days.

(21) Appl. No.: 11/966,285

(22) Filed: Dec. 28, 2007

(65) Prior Publication Data

US 2008/0225609 A1 Sep. 18, 2008

(30) Foreign Application Priority Data

Mar. 13, 2007 (KR) ............... 10-2007-0024445

(51) Int. Cl.
*G11C 5/14* (2006.01)
(52) U.S. Cl. ............... 365/189.09; 365/189.07; 365/189.05; 326/30; 326/33
(58) Field of Classification Search ............ 365/189.09, 365/189.07, 189.05; 326/30, 33
See application file for complete search history.

(56) References Cited

U.S. PATENT DOCUMENTS

| 7,019,555 | B2 | 3/2006 | Lee |
| 7,034,567 | B2 | 4/2006 | Jang |
| 7,064,989 | B2 * | 6/2006 | Na et al. ............... 365/193 |
| 7,151,390 | B2 | 12/2006 | Nguyen et al. |
| 7,151,700 | B2 | 12/2006 | Ba |
| 2004/0100837 | A1 * | 5/2004 | Lee ............... 365/200 |
| 2004/0141391 | A1 * | 7/2004 | Lee et al. ............... 365/200 |
| 2006/0226868 | A1 | 10/2006 | Lee et al. |
| 2007/0236248 | A1 * | 10/2007 | Park ............... 326/30 |
| 2008/0001622 | A1 * | 1/2008 | You ............... 326/30 |

FOREIGN PATENT DOCUMENTS

| JP | 2004-310981 | 4/2004 |
| JP | 2005-228458 | 8/2005 |
| JP | 2006-129423 | 5/2006 |
| KR | 1019990017038 | 3/1999 |
| KR | 1020040083814 A | 6/2004 |
| KR | 1020050022836 A | 8/2005 |

* cited by examiner

*Primary Examiner*—Anh Phung
*Assistant Examiner*—Toan Le
(74) *Attorney, Agent, or Firm*—Baker & McKenzie LLP

(57) ABSTRACT

A voltage generating circuit for a semiconductor memory apparatus according includes a data logic voltage generating unit that, when a data output unit outside a semiconductor memory apparatus outputs low-level data, generates an internal data logic voltage at the same potential level as the low-level data in response to an on-die termination signal. In addition, a reference voltage generating circuit for a semiconductor memory apparatus that uses the voltage generating circuit includes a reference voltage generating unit that can be configured to generate a reference voltage at an average potential level between a maximum potential and a minimum potential of input data.

20 Claims, 4 Drawing Sheets

US 7,742,347 B2

VOLTAGE GENERATING CIRCUIT AND REFERENCE VOLTAGE GENERATING CIRCUIT FOR SEMICONDUCTOR MEMORY APPARATUS, AND SEMICONDUCTOR SYSTEM USING THE SAME

CROSS-REFERENCES TO RELATED APPLICATION

The present application claims priority under 35 U.S.C. 119(a) to Korean Patent Application number 10-2007-0024445, filed on Mar. 13, 2007, in the Korean Intellectual Property Office, the contents of which are incorporated herein by reference in their entirety as if set forth in full.

BACKGROUND

1. Technical Field

The disclosure relates to a semiconductor memory apparatus, and in particular, to a reference voltage generating circuit that generates a reference voltage for discriminating data values of received external data.

2. Related Art

When discriminating a logic value of data based on the voltage level of a data signal, a semiconductor memory apparatus recognizes data as being at a logic high level, when the data signal has a voltage that exceeds a certain reference voltage. Similarly, if the data signal voltage level does not exceed the reference voltage, then the data will be recognized as a logic low level data signal.

As shown in FIG. 1, a general voltage generating circuit 101 for a semiconductor memory apparatus includes a voltage generating unit 10 and a data driver 20. The voltage generating unit 10 includes two resistors R1 and R2 that divide an external voltage (VDD) to generate a reference voltage (Vref). The reference voltage (Vref) is at a voltage level corresponding to 0.7 times as much as the external voltage (VDD).

The data driver 20 is supplied with the reference voltage (Vref), and compares the signal levels of input data (IN<0:1>).

An ideal reference voltage should be at an intermediate voltage level of a maximum potential input voltage level (VIH) and a minimum potential input voltage level (VIL), that is, (VIH+VIL)/2. In the example of FIG. 1, the maximum potential input voltage level (VIH) is (VDD). Therefore the reference voltage should ideally be (VDD+VIL)/2.

However, a conventional voltage generating unit 10 unconditionally generates the reference voltage (Vref) at 0.7 times the external voltage (VDD). Therefore, the actual reference voltage (Vref=0.7VDD) differs from the ideal reference voltage (Vref=(VDD+VIL)/2), and as the difference becomes large, the data driver 20 cannot operate normally. For this reason, it is difficult for the semiconductor memory apparatus to accurately discriminate the logic level of received data.

SUMMARY

A reference voltage generating circuit that can prevent a data discrimination error is described herein. According to one aspect, a voltage generating circuit can include a data logic voltage generating unit configured to generate an internal data logic voltage at the same potential level as low-level data in response to an on-die termination signal, when low-level data is received from an external data output unit.

According to another aspect, a reference voltage generating circuit for a semiconductor memory apparatus can use a voltage generating circuit that includes a reference voltage generating unit that can generate a reference voltage at an average potential level between a maximum potential and a minimum potential of input data.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 2:
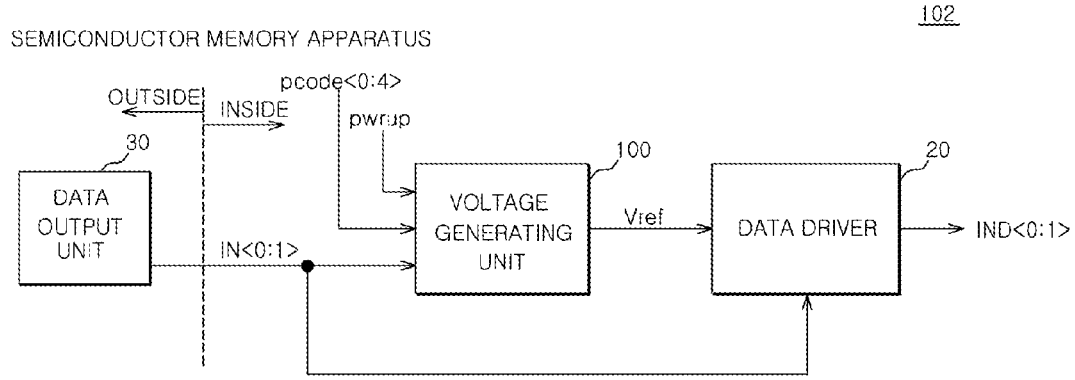
FIG. 2 is a block diagram of a semiconductor memory apparatus that includes a voltage generating circuit in accordance with one embodiment.

FIG. 2 is a block diagram of a semiconductor memory apparatus 102 that includes a voltage generating circuit according to an embodiment. Referring to FIG. 2, the semiconductor memory apparatus 102 can include a voltage generating circuit 100 and a data driver 20. The voltage generating circuit 100 can be configured to receive data (IN<0:1>), an on-die termination signal (pcode<0:4>), and a power-up signal (pwrup) to generate a reference voltage (Vref).

Data output unit 30 that can provide the data (IN<0:1>) to the voltage generating circuit 100 can be disposed outside the semiconductor memory apparatus 102.

Figure 1:
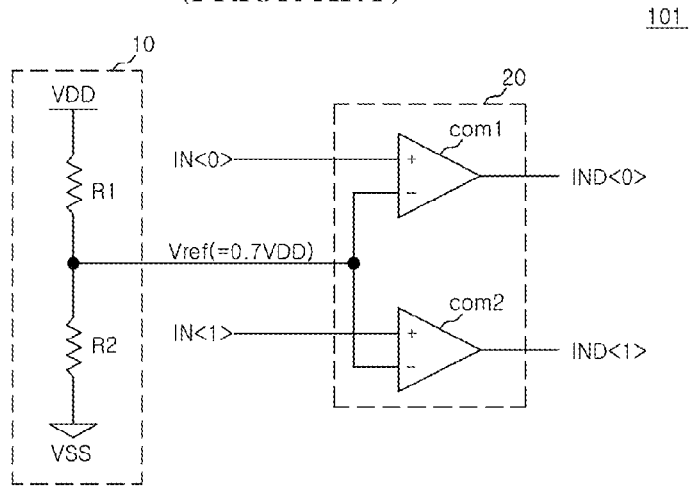
FIG. 1 is a circuit diagram of an exemplary semiconductor memory apparatus that includes a conventional voltage generating circuit.

As in the example of FIG. 1, the maximum potential level of the data (IN<0:1>) will be the level of the external source voltage (VDD), and the minimum potential level thereof can be a prescribed voltage (VIL_int). The data output unit 30 can, e.g., be a GPU (Graphics Processing Unit) or a chipset that is disposed outside the semiconductor memory apparatus 102.

The voltage generating circuit 100 according to this embodiment can be configured to generate a reference voltage (Vref) that corresponds to an average of the external source voltage (VDD) and the prescribed voltage (VIL_int). That is, the level of the reference voltage (Vref) can be (VDD+VIL_int)/2.

The data driver 20 can be configured to output internal data IND<0:1> at a high level when the level of the data (IN<0:1>) is higher than that of the reference voltage (Vref), and output the internal data IND<0:1> at a low level when the level of the data (IN<0:1>) is lower than that of the reference voltage (Vref). The terms high level and low level can refer to, e.g., a digital logic level, depending on the embodiment.

Figure 3:
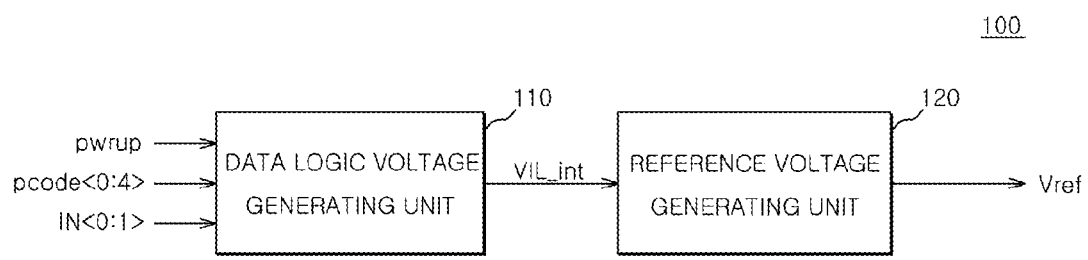
FIG. 3 is a block diagram of a voltage generating unit that can be included in the circuit illustrated in FIG. 2.

FIG. 3 is a block diagram illustrating the voltage generating circuit 100 in more detail. As shown in FIG. 3, the voltage generating circuit 100 can be configured to generate the reference voltage (Vref) that is equal to (VDD+VIL_int)/2 in response to the data (IN<0:1>), the on-die termination signal (pcode<0:4>), and the power-up signal (pwrup). The voltage generating circuit 100 can be configured to generate a first division ratio of impedance generated in response to the on-die termination signal (pcode<0:4>) to impedance when the data output unit 30 outputs a signal at the minimum potential low level. The voltage generating circuit 100 can be configured to divide the external voltage (VDD) according to the first division ratio to generate a minimum potential voltage (VIL_ext) at the low level of the data (IN<0:1>).

Further, the voltage generating circuit 100 can be configured to generate an internal data logic voltage (VIL_int) at the same voltage level as the minimum potential voltage (VIL_ext). In addition, the voltage generating circuit 100 can be configured to generate the reference voltage (Vref= (VDD+VIL_int)/2) from the data logic voltage (VIL_int).

The voltage generating circuit 100 can be configured to include a data logic voltage generating unit 110 and a reference voltage generating unit 120. The data logic voltage generating unit 110 can be configured to generate the internal data logic voltage (VIL_int) in response to the data (IN<0:1>), the on-die termination signal (pcode<0:4>), and the power-up signal (pwrup). The data logic voltage generating unit 110 can be configured to determine an impedance when the data output unit 30 outputs data at the low level, that is, during low-level driving, the on-die termination signal (pcode<0:4>), and the power-up signal (pwrup) to generate the internal data logic voltage (VIL_int). Hereinafter, for convenience, the internal data logic voltage (VIL_int) is referred to as "data logic voltage (VIL_int)".

The reference voltage generating unit 120 can be configured to receive the data logic voltage (VIL_int) to generate the reference voltage (Vref). At this time, the reference voltage (Vref) is an average of the external voltage (VDD) and the data logic voltage (VIL_int), that is, (VDD+VIL_int)/2.

Figure 4:
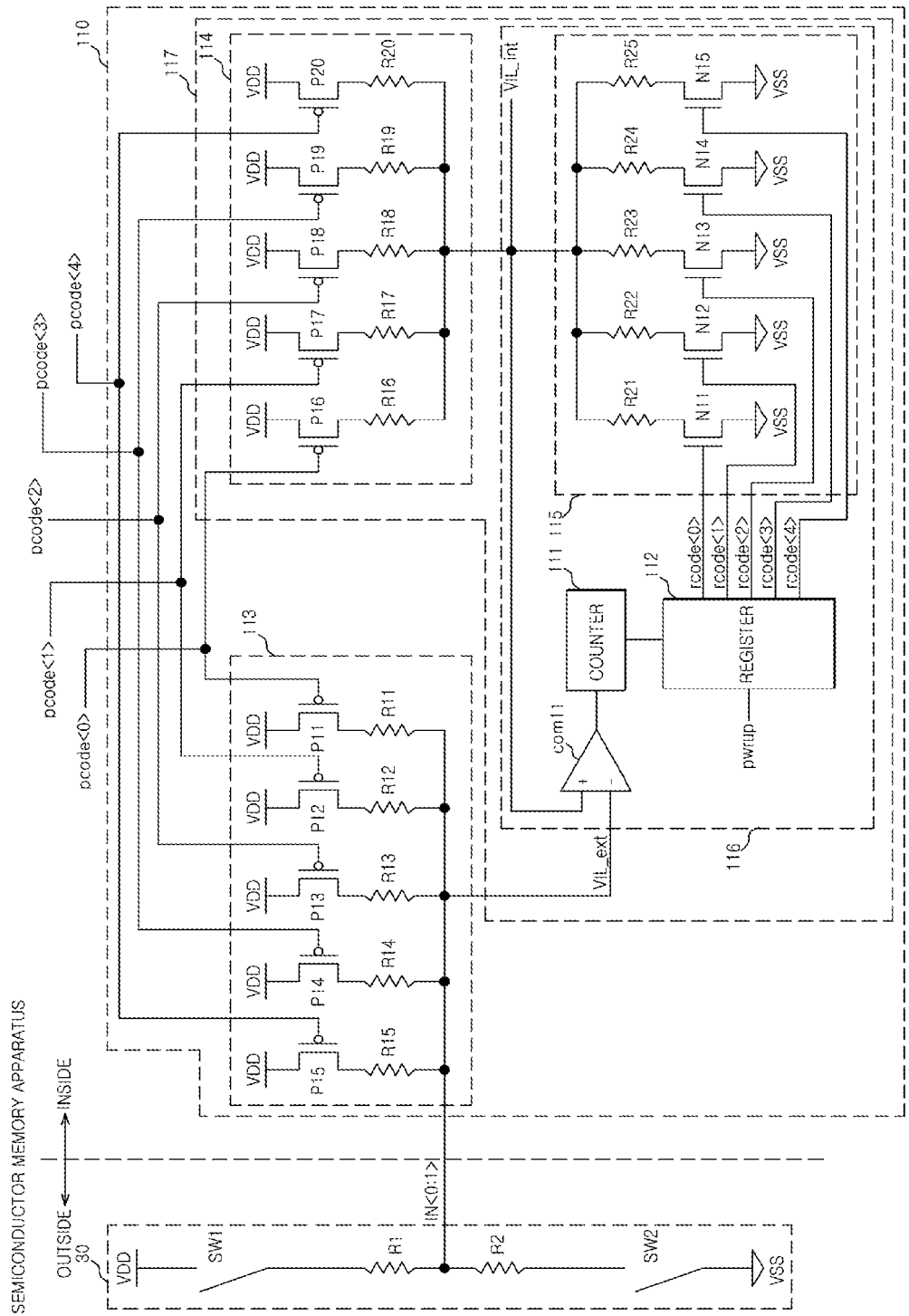
FIG. 4 is a circuit diagram of a data logic voltage generating unit that can be included in the voltage generating unit illustrated in FIG. 3.

FIG. 4 is a circuit diagram of a data logic voltage generating unit 110 as illustrated in FIG. 3. As shown in FIG. 4, the data logic voltage generating unit 110 can include a first impedance unit 113 and a logic voltage generating unit 117. The impedance of the first impedance unit 113 can be determined in response to the on-die termination signal (pcode<0:4>). The first impedance unit 113 can include first to fifth transistors P11, P12, P13, P14, and P15, and first to fifth resistors R11, R12, R13, R14, and R15.

The first transistor P11 can have a gate, to which the on-die termination signal (pcode<0>) is input, a source, to which the external voltage (VDD) can be applied, and a drain, to which one end of the first resistor R11 can be connected. The second transistor P12 can have a gate, to which the on-die termination signal (pcode<1>) can be input, a source, to which the external voltage (VDD) can be applied, a drain, to which one end of the second resistor R12 can be connected. The third transistor P13 has a gate, to which the on-die termination signal (pcode<2>) can be input, a source, to which the external voltage (VDD) can be applied, and a drain, to which one end of the third resistor R13 can be connected.

The fourth transistor P14 can be configured to have a gate, to which the on-die termination signal (pcode<3>) can be input, a source, to lo which the external voltage (VDD) can be applied, and a drain, to which one end of the fourth resistor R14 can be connected. The fifth transistor P15 can be configured to have a gate, to which the on-die termination signal (pcode<4>) can be input, a source, to which the external voltage (VDD) can be applied, and a drain, to which one end of the fifth resistor R15 can be connected. The other ends of the first to fifth resistors R11 to 15 are commonly connected to each other.

As described above, in the first impedance unit 113, the individual bits of the five-bit on-die termination signal (pcode<0:4>) can be correspondingly input to the gates of the first to fifth transistors P11 to P15. Accordingly, the impedance of the first impedance unit 113 can be determined according to the number of transistors to be turned on among the first to fifth transistors P11 to P15.

Meanwhile, as shown in FIG. 4, the data output unit 30 can include a first load element R1, a second load element R2, a first switch SW1, and a second switch SW2. The first and second load elements R1 and R2 can be connected in series between the external voltage (VDD) and a ground voltage VSS. The first switch SW1 can be connected between the external voltage (VDD) and the first load element R1, and the second switch SW2 can be connected between the second load element R2 and the ground voltage VSS. The data output unit 30 can output low-level data for a time set by an EMRS (Extended Mode Register Set). To allow the data output unit 30 to output the low-level data for a predetermined time, the first switch SW1 should be turned off for the predetermined time, and the second switch SW2 should be turned on for the predetermined time. Here, the first and second load elements R1 and R2 can be resistors.

In this embodiment, the external data logic voltage (VIL_ext) can be determined according to the first division ratio of the impedance of the first impedance unit 113 and the impedance of the data output unit 30.

The logic voltage generating unit 117 can be configured to receive the external data logic voltage (VIL_ext) and the on-die termination signal (pcode<0:4>) to generate the internal data logic voltage (VIL_int). Here, the internal data logic voltage (VIL_int) is at the same voltage level as the external data logic voltage (VIL_ext). The logic voltage generating unit 117 can includes a second impedance unit 114 and a variable impedance unit 116.

The second impedance unit 114 can be configured to receive the on-die termination signal (pcode<0:4>) to determine impedance of the second impedance unit 114 according to the level of the on-die termination signal (pcode<0:4>). The second impedance unit 114 can include sixth to tenth transistors P16 to P20, and sixth to tenth resistors R16 to R20. The connection structure of the second impedance unit can be the same as that of the first impedance unit 114. Accordingly, the second impedance unit 114 can have the same impedance as the first impedance unit 113.

The variable impedance unit 116 can be configured to include a first comparator comb11 a counter 111, a register 112, and a third impedance unit 115. The first comparator com11 can be configured to compare the data logic voltage (VIL_int) with the external data logic voltage (VIL_ext).

The counter 111 can be configured to count a variable resistance code (rcode<0:4>) in response to an output signal of the first comparator com11.

The register 112 can be configured to transmits the variable resistance code (rcode<0:4>) from the counter 111 to the third impedance unit 115. The register 112 can be configured to initialize the variable resistance code (rcode<0:4>) in response to the power-up signal (pwrup).

Impedance of the third impedance unit 115 is determined in response to the variable resistance code (rcode<0:4>). The third impedance unit 115 can include eleventh to fifteenth transistors N11 to N15, and eleventh to fifteenth resistors R21 to R25. The eleventh to fifteenth transistors N11 to N15 can be configured to selectively turned on according to the variable resistance code (rcode<0:4>), and the eleventh to fifteenth resistors R21 to R25 can be correspondingly connected to the eleventh to fifteenth transistors N11 to N15.

Here, the data logic voltage (VIL_int) can be determined according to a second division ratio of the impedance of the third impedance unit 115 and the impedance of the second impedance unit 114.

Figure 5:
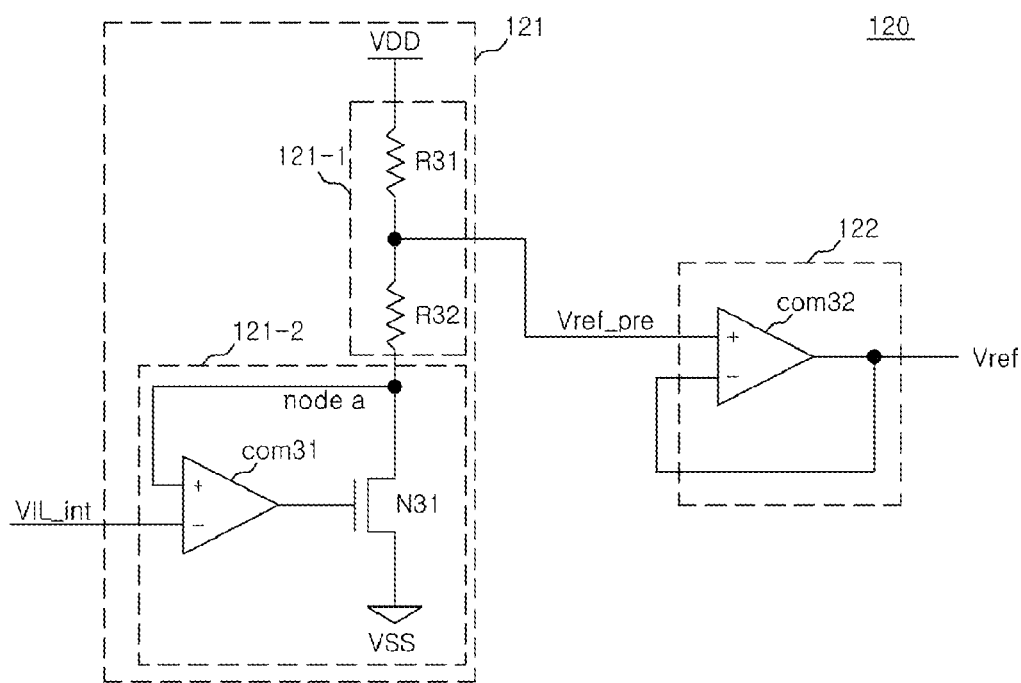
FIG. 5 is a circuit diagram of a reference voltage generating unit that can be included in the voltage generating unit illustrated in FIG. 3.

As shown in FIG. 5, the reference voltage generating unit 120 can include a voltage divider 121 and a buffer 122. The voltage divider 121 can be supplied with the data logic voltage (VIL_int) to generate a preliminary reference voltage (Vref_pre). The voltage divider 121 can include a series resistor unit 121-1 and a voltage applier 121-2.

The series resistor unit 121-1 can be supplied with the external voltage (VDD) and the data logic voltage (VIL_int) to generate the preliminary lo reference voltage (Vref_pre). The series resistor unit 121-1 can be configured to include sixteenth and seventeenth resistors R31 and R32 that have the same resistance and are connected in series. One end of the series resistor unit 121-1 can be connected to the external voltage (VDD), and the other end of which can be connected to the voltage applier 121-2. The series resistor unit 121-1 can generate the preliminary reference voltage (Vref_pre) from a connection node a of the sixteenth and seventeenth resistors R31 and R32 on the basis of the external voltage (VDD) supplied from one end of the sixteenth resistor R31 and the data logic voltage (VIL_int) supplied from the other end of the seventeenth resistor R17.

The voltage applier 121-2 can be configured to supply a voltage at the same voltage level as the data logic voltage (VIL_int) to the series resistor unit 121-1. The voltage applier 121-2 can include a second comparator com31 and a sixth transistor N31. The second comparator com31 can be supplied with the data logic voltage (VIL_int) through a first input terminal. The sixth transistor N31 can have a gate, to which an output signal of the second comparator com31 is input, a source connected to a ground terminal VSS, and a drain commonly connected to a second input terminal of the second comparator com31 and the series resistor unit 121-1.

The buffer 122 can be supplied with the preliminary reference voltage (Vref_pre), buffer the preliminary reference voltage (Vref_pre), and output the preliminary reference voltage (Vref_pre) as the reference voltage (Vref). The buffer 122 can be composed of a third comparator com32. The third comparator com32 can be configured to compare the preliminary reference voltage (Vref_pre) with an output signal of third comparator com32.

Hereinafter, the operation of the voltage generating circuit 100 will now be described with reference to the accompanying drawings (FIGS. 2 to 5).

The data output unit 30 outside the semiconductor memory apparatus can be configured to perform low-level driving to output the data (IN<0:1>) at the low level. Then, the external voltage (VDD) can be divided according to the first division ratio of impedance of the second load element R2 and impedance of the first impedance unit 113 in response to the on-die termination signal (pcode<0:4>). The external voltage (VDD) can be divided according to the first division ratio to generate the external data logic voltage (VIL_ext).

The second impedance unit 114 can be driven in response to the on-die termination signal (pcode<0:4>), similar to the first impedance unit 113, and thus the second impedance unit 114 can have the same impedance as the first impedance unit 113.

The variable impedance unit 116 can be configured to generate the variable resistance code (rcode<0:4>) in order to generate the data logic voltage (VIL_int) at the same voltage level as the external data logic voltage (VIL_ext). The impedance of the third impedance unit 115 can be determined in response to the variable resistance code (rcode<0:4>). The external voltage (VDD) can be divided according to the impedance of the second impedance unit 114 and the impedance of the third impedance unit 115, that is, according to the second division ratio. Accordingly, the voltage obtained by dividing the external voltage (VDD) according to the second division ratio, lo that is, the data logic voltage (VIL_int) can be at the same voltage level as the external data logic voltage (VIL_ext).

The operation that causes the data logic voltage (VIL_int) and the external data logic voltage (VIL_ext) to be at the same voltage level will be described in detail. The first comparator com11 compares the external data logic voltage (VIL_ext) with the data logic voltage (VIL_int), and the counter 111 operates until the external data logic voltage (VIL_ext) and the data logic voltage (VIL_int) are at the same voltage level. The counter 111 counts the variable resistance code (rcode<0:4>). The register 112 initializes the variable resistance code (rcode<0:4>) in response to the power-up signal (pwrup) and outputs the variable resistance code (rcode<0:4>) to the third impedance unit 115.

As a result, the impedance of the second impedance unit 114 is determined in response to the on-die termination signal (pcode<0:4>), and the impedance of the third impedance unit 115 varies until the external data logic voltage (VIL_ext) and the data logic voltage (VIL_int) are at the same voltage level. If the external data logic voltage (VIL_ext) and the data logic voltage (VIL_int) are at the same voltage level, the register 112 stores the variable resistance code (rcode<0:4>) and fixes the impedance of the third impedance unit 115.

Accordingly, the data logic voltage (VIL_int) at the same voltage level as the external data logic voltage (VIL_ext) is output according to the second division ratio of the impedance of the second impedance unit 114 and the impedance of the third impedance unit 115.

The data logic voltage (VIL_int) can be applied to the voltage applier 121-2 of the voltage divider 121. Accordingly, the node a can be at the same voltage level as the data logic voltage (VIL_int), and the series resistor unit 121-1 can output the preliminary reference voltage (Vref_pre=(VDD+VIL_int)/2) at a voltage level corresponding to an intermediate voltage level of the external voltage (VDD) and the data logic voltage (VIL_int), that is, an average voltage level.

The buffer 122 can buffer the preliminary reference voltage (Vref_pre) to output the preliminary reference voltage (Vref_pre) as the reference voltage (Vref).

If the data (IN<0:1>) to be input from the outside is higher than the potential level of the reference voltage (Vref=(VDD+VIL_int)/2), then the data driver 20 can output data (IND<0:1>) at the high level. Further, if the data (IN<0:1>) to be input from the outside is lower than the potential level of the reference voltage (Vref), then the data driver 20 outputs data (IND<0:1>) at the low level.

Figure 6:
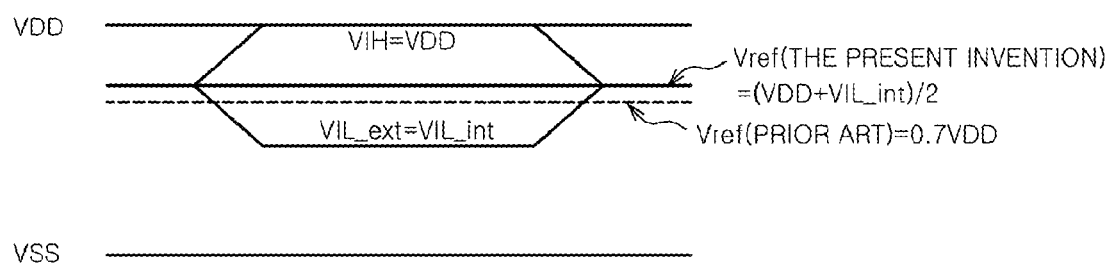
FIG. 6 is a diagram showing the comparison result of the output of the exemplary voltage generating circuit of FIG. 1 and the output of the voltage generating circuit of FIG. 2.

FIG. 6 is a diagram showing the comparison result of an output of a conventional reference voltage generating circuit and an output of a reference voltage generating circuit according to an embodiment described herein.

In the conventional circuit, in order to discriminate data to be input from outside the semiconductor memory apparatus, the value of input data is discriminated on the basis of the reference voltage (Vref=0.7 VDD), which is 0.7 times the external voltage (VDD). In this case, when the reference voltage (Vref) is different from an intermediate value in a swing range of the potential level of the data, that is, an average value, the semiconductor memory apparatus does not receive the data correctly. At this time, the swing range of the potential level of the data is from the external voltage (VDD) to the prescribed voltage (VIL_ext).Therefore, the voltage generating 15 circuit 102 can generate the data logic voltage (VIL_int) at the same level as the voltage (VIL_ext), which corresponds to the low level of the data.

Returning to FIG. 4, one embodiment of the operation that generates the data logic voltage (VIL_int) will be briefly described. The data output unit 30 can output low-level data for a predetermined time set by the EMRS. The external voltage (VDD) can be divided according to the first division ratio of impedance of the first impedance unit 113 in response to the on-die termination signal (pcode<0:4>) to impedance of the second load element R2 of the data output unit 30 to thereby generate the external data logic voltage (VIL_ext).

The second impedance unit 114 can have the same impedance as the first impedance unit 113. This is because the second impedance unit 114 can have the same structure as the first impedance unit 113, and receive the same on-die termination signal (pcode<0:4>) as the first impedance unit 113.

Initial impedance of the third impedance unit 115 can be determined in response to the initialized variable resistance code (rcode<0:4>). The initialized variable resistance code (rcode<0:4>) refers to a signal that is output from the register 112.

The data logic voltage (VIL_int) can be configured to form lo according to a division ratio of impedance of the second impedance unit 114 to impedance of the third impedance unit 115.

The first comparator com11 can be configured to compare the data logic voltage (VIL_int) with the external data logic voltage (VIL_ext).

The counter 111 can be configured to count the variable resistance code (rcode<0:4>) in response to an output signal of the first comparator com11.

The register 112 can be configured to store and output the variable resistance code (rcode<0:4>). Register 112 can output the variable resistance code (rcode<0:4>) counted by the counter 111 for a time set by an MRS (Mode Register Set), and only output the last stored variable resistance code (rcode<0:4>) if the set time elapses. As a result, the first comparator com11, the counter 111, and the register 112 are operated in order to generate the data logic voltage (VIL_int) at the same voltage level as the external data logic voltage (VIL_ext).

The generation of reference voltage (Vref) will be briefly described with reference to FIG. 5.

The second comparator com31 can be configured to compare the data logic voltage (VIL_int) and the voltage at the node a, and can cause the voltage at the node a to be at the same voltage level as the data logic voltage (VIL_int).

The series resistor unit 121-1 can be configured to output the preliminary reference voltage (Vref_pre=(VDD+VIL_int)/2) that corresponds to an average of the external voltage (VDD) and the voltage at the node a.

The buffer 122 can buffer the preliminary reference voltage (Vref_pre) and output the preliminary reference voltage (Vref_pre) as the reference voltage (Vref).

A reference voltage generating circuit that uses the voltage generating circuit can be configured to generate the reference voltage (Vref=(VDD+VIL_int)/2) that corresponds to an intermediate value of the external voltage (VDD) and the data logic voltage (VIL_int), that is, an average. Further, a semiconductor memory apparatus, to which the reference voltage generating circuit is applied, can be supplied with the reference voltage (Vref=(VDD+VIL_int)/2), which can correspond to the intermediate value in the swing range of data, and discriminates the data value.

As a result, the semiconductor memory apparatus can be configured to receive the data (IN<0:1>), the level of which swings between the external voltage (VDD) and the external data logic voltage (VIL_ext), and discriminate the data (IN<0:1>) on the basis of the reference voltage (Vref) at an intermediate voltage level of the external voltage (VDD) and the external data logic voltage (VIL_ext), that is, at an average voltage level. Therefore, data reliability in the semiconductor memory apparatus can be increased.

Although the impedance, when the data output unit 30 outside the semiconductor memory apparatus performs low-level driving, is used in the embodiments described herein, it should be noted that the embodiments described herein can be implemented using resistive elements having the same impedance.

A voltage generating circuit according to an embodiment, and a lo reference voltage generating circuit for a semiconductor memory apparatus using the same, generates a reference voltage at an intermediate level of a high level and a low level of data to be input from the outside. Therefore, the semiconductor memory apparatus can discriminate external data on the basis of the reference voltage at an average level of the high level and the low level of the data, thereby increasing data reliability in the semiconductor memory apparatus.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A voltage generating circuit for a semiconductor memory apparatus, comprising:
    a data logic voltage generating unit configured to generate an internal data logic voltage at the same potential level as low-level data in response to an on-die termination signal,
    wherein the data logic voltage generating unit receives the low-level data received from an external data output unit and the on-die termination signal.

2. The voltage generating circuit of claim 1, wherein the data logic voltage generating unit includes a unit that generates impedance in response to the on-die termination signal, and wherein the data logic voltage generating unit divides an external voltage at a division ratio of impedance generated in response to the on-die termination signal to impedance of the data output unit when the data output unit outputs the low-level data, to thereby generate an external data logic voltage.

3. The voltage generating circuit of claim 2, wherein the internal data logic voltage is at the same voltage level as the external data logic voltage.

4. The voltage generating circuit of claim 2, wherein the data logic voltage generating unit includes:
    a first impedance unit that has impedance of which is determined in response to the on-die termination signal; and
    a logic voltage generating unit that compares the external data logic voltage with the internal data logic voltage to generate the internal data logic voltage at the same voltage level as the external data logic voltage.

5. The voltage generating circuit of claim 4, wherein the logic voltage generating unit includes:
    a second impedance unit that has impedance of which is determined in responds to the on-die termination signal; and a variable impedance unit that generates the internal data logic voltage at the same voltage level as the external data logic voltage, in cooperation with the second impedance unit.

6. The voltage generating circuit of claim 5, wherein the variable impedance unit includes:
   a comparator that compares the external data logic voltage with the internal data logic voltage;
   a counter that counts a variable resistance code in response to an output signal of the comparator;
   a register that initializes the variable resistance code in response to a power-up signal and outputs the variable resistance code; and
   a third impedance unit that has impedance of which is determined in response to the variable resistance code output from the register.

7. A reference voltage generating circuit for a semiconductor memory apparatus, comprising:
   a data logic voltage generating unit that generates a data logic voltage at the same potential level as a minimum potential of input data; and
   a reference voltage generating unit that generates a reference voltage at an average potential level between the minimum potential output from the data logic voltage generating unit and a maximum potential of the input data.

8. The reference voltage generating circuit of claim 7, wherein the reference voltage generating unit includes:
   a voltage divider that is applied with the data logic voltage and generates a preliminary reference voltage at an average voltage level of an external voltage as a maximum potential of the data and the data logic voltage as the minimum potential of the data; and
   a buffer that is applied with the preliminary reference voltage, buffers the preliminary reference voltage, and outputs the preliminary reference voltage as the reference voltage.

9. The reference voltage generating circuit of claim 8, wherein the voltage divider includes:
   a series resistor unit that is applied with the external voltage and the data logic voltage, and outputs an average voltage of the external voltage and the data logic voltage as the preliminary reference voltage; and
   a voltage applier that applies the data logic voltage to one end of the series resistor unit.

10. The reference voltage generating circuit of claim 9, wherein the series resistor unit includes:
    a first resistive element that has one end, to which the external voltage is applied; and
    a second resistive element that has one end connected to the other end of the first resistive element, and the other end, to which the data logic voltage is applied, and
    the preliminary reference voltage is output from a node at which the first resistive element and the second resistive element are connected to each other.

11. The reference voltage generating circuit of claim 10, wherein the first resistive element and the second resistive element have the same resistance.

12. The reference voltage generating circuit of claim 9, wherein the voltage applier includes:
    a comparator that has a first input terminal, to which the data logic voltage is applied; and
    a transistor that has a gate, to which an output signal of the comparator is input, a source connected to a ground terminal, and a drain commonly connected to a second input terminal of the comparator and the series resistor unit.

13. The reference voltage generating circuit of claim 8, wherein the buffer is a comparator that has a first input terminal, to which the preliminary reference voltage is applied, and a second input terminal and an output terminal connected to each other.

14. A semiconductor system comprising:
    an external data output unit that outputs data to a semiconductor memory apparatus;
    a data logic voltage generating unit that generates a first division ratio of first impedance of the external data output unit, which outputs low-level data, and second impedance to be generated in response to an on-die termination signal, and a second division ratio of the second impedance and third variable impedance that is the same as the first division ratio; and
    a reference voltage generating unit that generates reference voltage at an average voltage level of an internal data logic voltage, which is obtained by dividing an external voltage according to the second division ratio, and the external voltage.

15. The semiconductor system of claim 14, wherein the data logic voltage generating unit includes a first impedance unit that generates the second impedance in response to the on-die termination signal.

16. The semiconductor system of claim 15, wherein the data logic voltage generating unit further includes a second impedance unit that generates the same impedance as the second impedance in response to the on-die termination signal.

17. The semiconductor system of claim 16, wherein the data logic voltage generating unit further generates an external data logic voltage by dividing the external voltage according to the first division ratio, and includes a variable impedance unit that generates the third impedance to cause the internal data logic voltage to be at the same voltage level as the external data logic voltage, and
    the variable impedance unit includes:
    a comparator that compares the external data logic voltage with the internal data logic voltage;
    a counter that counts a variable resistance code in response to an output signal of the comparator;
    a register that initializes the variable resistance code in response to a power-up signal and outputs the variable resistance code; and
    a third impedance unit that has impedance of which is determined in response to the variable resistance code output from the register.

18. The semiconductor system of claim 14, wherein the reference voltage generating unit includes:
    a voltage divider that is supplied with the external voltage and the internal data logic voltage, and generates a preliminary reference voltage at an average voltage level of the external voltage and the internal data logic voltage; and
    a buffer that is supplied with the preliminary reference voltage, buffers the preliminary reference voltage, and outputs the preliminary reference voltage as the reference voltage.

19. The semiconductor system of claim 18, wherein the voltage divider includes a series resistor unit,
    the series resistor unit includes a first resistive element that has one end, to which the external voltage is applied, and a second resistive element that has one end connected to the other end of the first resistive element, and the other end, to which the internal data logic voltage is applied, and the preliminary reference voltage is output from a node at which the first resistive element and the second resistive element are connected to each other.

20. The semiconductor system of claim 19, wherein the voltage divider further includes a voltage applier, and the voltage applier includes a comparator that compares a voltage at the other end of the second resistive element with the internal data logic voltage so as to apply a voltage at the same voltage level as the internal data logic voltage to the other end of the second resistive element, and a transistor that has a gate, to which an output signal of the comparator is input, a drain connected to a node, at which the comparator and the second resistive element are connected to each other, and a source connected to a ground terminal.

* * * * *